United States Patent
Delacruz et al.

(10) Patent No.: US 11,804,469 B2
(45) Date of Patent: Oct. 31, 2023

(54) ACTIVE BRIDGING APPARATUS

(71) Applicant: Invensas LLC, San Jose, CA (US)

(72) Inventors: Javier A. Delacruz, San Jose, CA (US); Belgacem Haba, Saratoga, CA (US); Rajesh Katkar, Milpitas, CA (US)

(73) Assignee: Invensas LLC, San Jose, CA (US)

( * ) Notice: Subject to any disclaimer, the term of this patent is extended or adjusted under 35 U.S.C. 154(b) by 410 days.

(21) Appl. No.: 16/868,701

(22) Filed: May 7, 2020

(65) Prior Publication Data

US 2021/0351159 A1 Nov. 11, 2021

(51) Int. Cl.
| | |
|---|---|
| *H01L 23/48* | (2006.01) |
| *H01L 25/065* | (2023.01) |
| *H01L 23/50* | (2006.01) |
| *H01L 23/00* | (2006.01) |
| *H03K 17/56* | (2006.01) |
| *H03K 19/0175* | (2006.01) |

(52) U.S. Cl.
CPC .......... *H01L 25/0652* (2013.01); *H01L 23/50* (2013.01); *H01L 24/08* (2013.01); *H01L 24/89* (2013.01); *H03K 17/56* (2013.01); *H03K 19/017509* (2013.01); *H01L 2224/08145* (2013.01); *H01L 2224/80895* (2013.01); *H01L 2224/80896* (2013.01)

(58) Field of Classification Search
CPC ............. H01L 2225/0652; H01L 23/50; H01L 25/0652; H01L 2224/80895–80896; H01L 2224/08145
See application file for complete search history.

(56) References Cited

U.S. PATENT DOCUMENTS

| | | | |
|---|---|---|---|
| 5,418,687 A | 5/1995 | Chen | |
| 8,742,576 B2 | 6/2014 | Thacker et al. | |
| 9,472,529 B2 | 10/2016 | Vora | |
| 9,559,081 B1 * | 1/2017 | Lai | H01L 23/5389 |
| 9,666,559 B2 | 5/2017 | Wang et al. | |
| 11,387,214 B2 | 7/2022 | Wang et al. | |

(Continued)

FOREIGN PATENT DOCUMENTS

| | | |
|---|---|---|
| KR | 20170109865 A | 10/2017 |
| WO | WO2016061312 A1 | 4/2016 |

OTHER PUBLICATIONS

U.S. Appl. No. 16/905,766, filed Jun. 18, 2020, 25 pages.

(Continued)

*Primary Examiner* — Hoa B Trinh
(74) *Attorney, Agent, or Firm* — Haley Guiliano LLP

(57) ABSTRACT

Techniques and mechanisms for coupling chiplets to microchips utilizing active bridges. The active bridges include circuits that provide various functions and capabilities that previously may have been located on the microchips and/or the chiplets. Furthermore, the active bridges may be coupled to the microchips and the chiplets via "native interconnects" utilizing direct bonding techniques. Utilizing the active bridges and the direct bonding techniques of the active bridges to the microchips and the chiplets, the pitch for the interconnects can be greatly reduced going from a pitch in the millimeters to a fine pitch that may be in a range of less than one micron to approximately five microns.

20 Claims, 6 Drawing Sheets

(56) References Cited

U.S. PATENT DOCUMENTS

| | | | |
|---|---|---|---|
| 2007/0023921 A1* | 2/2007 | Zingher | H01L 23/5387 |
| | | | 257/E23.177 |
| 2013/0141442 A1 | 6/2013 | Brothers et al. | |
| 2013/0320567 A1 | 12/2013 | Thacker et al. | |
| 2015/0255417 A1 | 9/2015 | Farooq et al. | |
| 2016/0027761 A1 | 1/2016 | Co et al. | |
| 2017/0062383 A1 | 3/2017 | Yee et al. | |
| 2017/0069575 A1* | 3/2017 | Haba | H01L 23/5386 |
| 2018/0130784 A1 | 5/2018 | Pagani | |
| 2018/0337129 A1 | 11/2018 | Li et al. | |
| 2018/0366436 A1* | 12/2018 | Wang | H01L 23/3114 |
| 2019/0319626 A1 | 10/2019 | Dabral et al. | |
| 2020/0273843 A1* | 8/2020 | Zhong | H01L 24/20 |
| 2021/0125967 A1* | 4/2021 | Zhai | H01L 25/105 |
| 2021/0343690 A1* | 11/2021 | Salmon | H01L 23/473 |

OTHER PUBLICATIONS

International Search Report and Written Opinon for PCT Application PCT/US2020/038642 dated Oct. 7, 2020, a counterpart foreign application for U.S. Appl. No. 16/905,766, pp. 1-pp. 13.

* cited by examiner

ACTIVE BRIDGING APPARATUS

BACKGROUND

In microelectronic systems, electronic circuits are fabricated on a wafer of semiconductor material, such as silicon. The wafer with electronic circuits may be bonded to one or more other wafers, bonded to individual dies, or itself diced (singulated) into numerous dies, each die containing a copy of the circuit. Each die that has a functional integrated circuit is known as a microchip, or "chip." When specific functions from a library of functions are assigned to individual chips, or when a large monolithic chip is emulated by a collection of smaller chips, these smaller chips, or chips with specific or proprietary functions, may be referred to as "chiplets." As used herein, unless otherwise indicated, chiplet means a complete subsystem (intellectual property core) (IP core), a reusable unit of logic, memory and/or other circuitry, on a single die. A library of chiplets may provide routine or well-established IP-block functions.

Conventionally, microchips and chiplets need standard interfaces to communicate and interact with each other and with larger microelectronic layouts that make up microelectronic devices. The use of such standard interfaces is expected in the industry and taken for granted. It is assumed in the industry that every block of logic that needs input and output (I/O) will work through a standard interface including at least some I/O protocol that generally includes level-shifting, signal amplification, and standard ESD protection. A "standard interface," as used herein, means "a point of interconnection between two systems or parts of a system, e.g., that between a processor and a peripheral, at which the physical, electrical, and logical parameters are in accordance with predetermined values. An interface may be classed as standard on the basis of manufacturer, industry, or international usage. The I/O channels of a processor may be classed as standard interfaces because they are common to processors of that type, or common to more than one type of peripheral—but they may be specific to a manufacturer. Some interfaces are de facto industry standards and can be used to connect devices from different vendors. Other interfaces are standardized by agreement within trade associations or international committees or consortiums" (A Dictionary of Computing 2004, originally published by Oxford University Press 2004). Examples of these are LPDDR, DDR, PCI-Express and MIPI.

Space on microchips is very valuable. The chances of having a defect increase exponentially with die area increases. Thus, various functions and interfaces that can be provided in other devices such as, for example, chiplets, can save space on the microchips thereby allowing for larger circuits, other circuits and/or other functions or a reduction in area of a given chiplet to be provided on the microchips. Currently, in some configurations, chiplets are mounted on the microchips. Other designs for microelectronic devices include microchips and chiplets mounted in side-by-side configurations, e.g., the chiplets are in the same plane as the microchips and around a periphery of the microchips. In some instances, these configurations can result in higher latency due to constraints with respect to connections of the chiplets to the microchips thereby resulting in a limitation of performance.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

DESCRIPTION OF EXAMPLE EMBODIMENTS

Overview

Figure 1A:
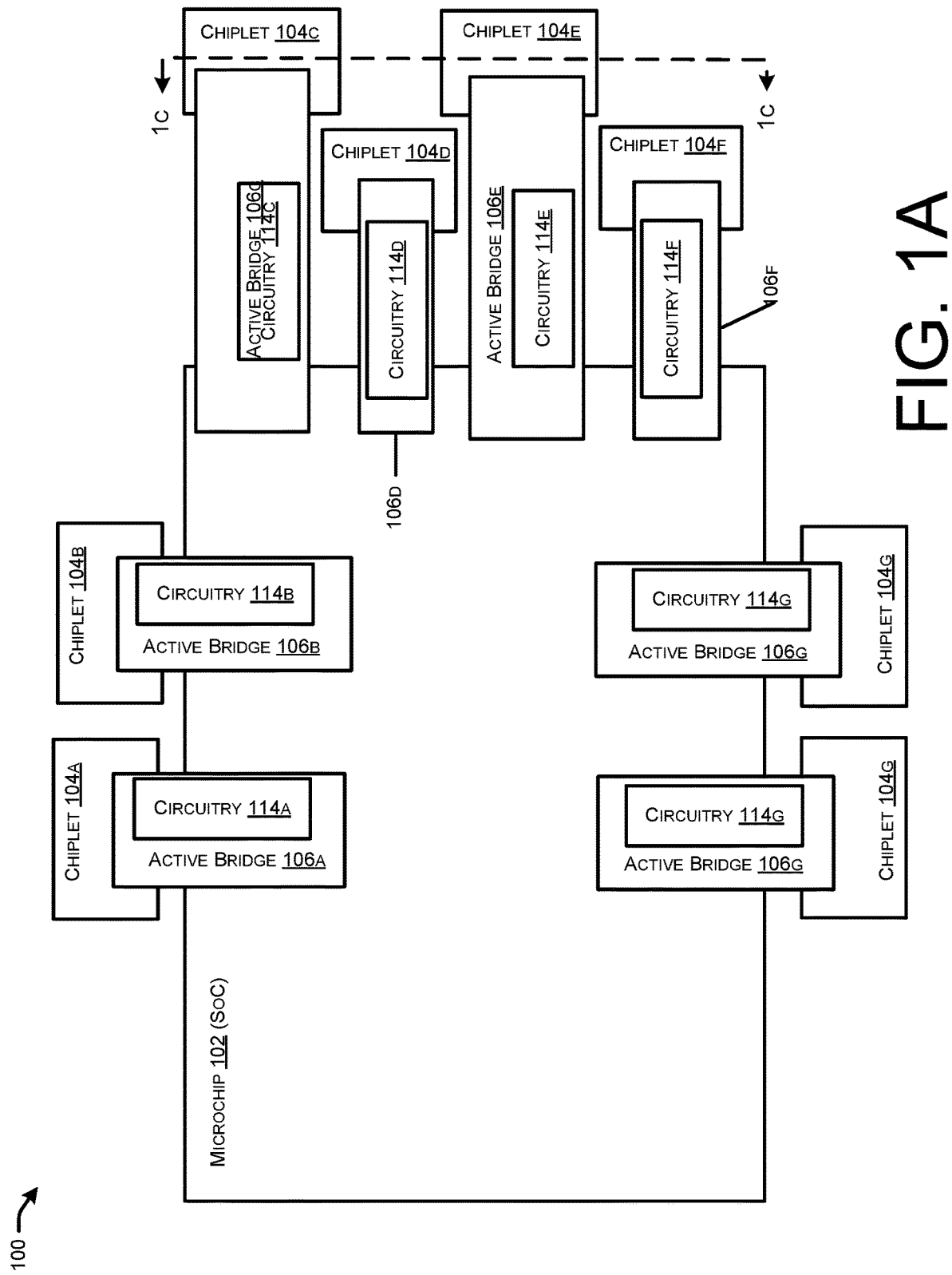
FIGS. 1A-1E schematically illustrate an example of a microelectronic device that includes a microchip configured as a system on chip (SoC) and a plurality of chiplets coupled to the microchip using active bridges.

This disclosure describes example arrangements of chiplets coupled to microchips utilizing active bridges. The active bridges include circuits that provide various functions and capabilities that previously may have been located on the microchips and/or the chiplets. Furthermore, in some examples, the active bridges may be coupled to the microchips and the chiplets via "native interconnects" utilizing direct bonding techniques. Other examples of coupling the active bridges to the microchips include nano-particle interconnected interfaces and microbump technology. Utilizing the active bridges and the direct bonding techniques of the active bridges to the microchips and the chiplets, the pitch for the interconnects can be greatly reduced going from a pitch in the millimeters to a fine pitch that may be less than 20 microns. In some examples, the pitch may be in a range of about five microns to about one micron, while in some examples the pitch may be less than one micron. This can greatly increase the performance of microelectronic devices including microchips coupled to chiplets utilizing active bridges and direct bonding techniques by increasing speed and reducing latency.

"Standard interface," as used herein, accords with the dictionary definition as given in the Background section above, and more briefly means "additional hardware, software, routing, logic, connections, or surface area added to the core logic real estate or functionality of a die in order to meet an industry or consortium specification for interfacing, connecting, or communicating with other components or signals outside the die." "Direct-bonding" as used herein means direct-contact metal-to-metal bonding, oxide bonding, or fusion bonding between two metals, such as copper to copper (Cu—Cu) metallic bonding between two copper conductors in direct contact, with at least partial crystal lattice cohesion. Such direct-bonding may be provided by a hybrid bonding technique such as DBI®. (direct bond interconnect) technology to be described below, and other metal bonding techniques (Invensas Bonding Technologies, Inc., an Xperi Corporation company, San Jose, Calif.). "Core" and "core-side" as used herein mean at the location, signal, and/or level present at the functional logic of a particular die, as opposed to at the location, signal, and/or level of an added standard interface defined by a consortium. Thus, a signal is raw or "native" if it is operational at the core functional logic level of a particular die, without certain modifications, such as additional serialization, added electrostatic discharge (ESD) protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. "Active" as used herein (active base die) accords with the usual meaning of active in the semiconductor arts, as opposed to "passive." Active components include transistor logic and amplifying components, such as the transistors. Passive components, on the other hand, do not introduce net energy into a circuit, and do not use an original source of power, except for power derived from other circuits connected to the passive circuit. While the techniques set forth herein generally refer to active dies, the techniques may also be applied to passive devices and enjoy the same or similar benefits.

The native interconnects for conducting such native signals from the core-side of a die can provide continuous circuits disposed through two or more cross-die boundaries without amplifying or modifying the native signals, except as desired to accommodate dies from different manufacturing processes. From a signal standpoint, the native signal of the IP core of one die is passed directly to other dies. e.g., active bridges, via the directly bonded native interconnects, with no modification of the native signal or negligible modification of the native signal, thereby forgoing standard interfacing and consortium-imposed input/output protocols.

The active bridges may serve as an accelerator chiplet to the chiplets configured as memory and, as previously noted, provide the interface between the microchips and the chiplets. For example, instead of a 1024 pin interface (plus addressing lines), up to a 50,000 pin interface may be provided by moving the interfaces to the active bridges. This provides a much finer pitch and increases speed by moving the interfaces closer to the processors of the microchip. For example, in previous configurations, the lines between the processors and memory may be 6 millimeters or more. Additionally, critical area on the microchip (and/or the chiplets) that in previous configurations or arrangements were utilized for an application-specific circuit (ASIC) that would have been used for large interface IP may now be used for other circuitry and functions on the microchips, and even the chiplets. For example, by using the active bridges, a 50% or more increase in additional space for further processors and/or functions on the microchips may be realized.

In configurations where the chiplets are high bandwidth memory (HBM), the active bridges may include static random access memory (SRAM) or other memory that may be used for buffering of data prior to sending the data to the HBM for either scheduling or faster access to memory. For example, chiplets may be configured as memory chiplets in the form of HBM that may provide level 4 (L4) memory and the circuitry within the active bridges may be in the form of SRAM that may provide level 3 (L3) memory, e.g., cache. Placement of the L3 cache may allow for faster access because the active bridge may be direct bonded to the microchip directly over processing elements of the microchip.

Additionally, use of the active bridges may allow for memory access to be placed where it is more ideal, e.g., memory access may not need to be along the periphery of the microchips and/or the chiplets. The active bridges may allow for memory access to be placed closer to (e.g., directly above) a processor or other component of the microchip and/or further away from the peripheral edges of the microchips and the chiplets. For example, memory access may be microns away from the processor as opposed millimeters. In configurations where the chiplets represent memory, changes in the memory standard may be implemented by simply changing the chiplet and/or the active bridges. Thus, it is possible to switch between HBM 2, HBM 3, HBM 4, double data rate (DDR), low-power double data rate (LPDDR), etc.

The active bridges may also allow for increased controller/physical (PHY) layer circuits and functionality. For example, the circuitry within the active bridges may be in the form of PHY layer circuits. This can lead to improved performance of a microelectronic device that includes the microchips and chiplets coupled by the active bridges. Furthermore, the active bridges may allow for the controller/PHY to be repeated utilizing multiple active bridges in a microelectronic device to couple a microchip and multiple chiplets. Previous configurations of microelectronic devices have required controller and PHY circuitry at both the microchips and the chiplets. By placing the controller and PHY circuitry on the active bridges, the overall system, e.g., microelectronic device, is simplified by eliminating the cycles lost in the extra circuitry of having controllers and PHY circuitry on both the microchips and the chiplets.

The active bridges may include one or two standard designs/sizes thereby allowing for repeatability with respect to structure within a microelectronic device. Other active bridges may be custom designed depending upon need of a specific microelectronic device. Furthermore, the limited sizes of the active bridges mean that needed redesigns for a microelectronic device may be more inexpensively and efficiently implemented by altering designs of the active bridges as opposed to the need for redesigning the microchips.

The active bridges may also provide active circuitry that eliminates the limit on the connection length of the HBM data lines (DQ) lines. This may lead to improved overall performance and functionality.

Examples of microchip and chiplet designs that may be connected using active bridges include, for example, microchips configured as a system on chip (SoC) and chiplets configured as memory. As used herein, SoC includes, for example, field-programmable gate arrays (FPGAs), application-specific standard products (ASSPs), application-specific integrated circuits, (ASICs), etc. The list is only for explanatory purposes and is not meant to be limiting. The active bridge may include circuitry that provides a buffered interconnect between two microchips. The active bridge may also include circuitry that provides an interconnect that provides level shifting between the microchip and a coupled chiplet. The active bridge may also include circuitry that provides re-clocking between the two interconnected dies. Furthermore, the active bridges may include circuitry that allows for clock gating and voltage gating between interconnected dies connected by the active bridges. Also, the clock distribution between the interconnected dies may be handled by circuitry of the active bridges connecting the two dies.

Example Embodiments

FIG. 1A schematically illustrates an example of a microelectronic device 100 that includes a microchip or base die 102 configured as a system on chip (SoC) and a plurality of chiplets or secondary dies 104*a*-104*h* (referred to collectively as chiplets 104). More or fewer chiplets 104 may be included depending on the design of the microelectronic device 100. In configurations, the microelectronic device 100 may include more than one microchip 102.

The microchip 102 is coupled to the chiplets 104 utilizing active bridges 106a-106h (referred to collectively as active bridges 106). More or fewer active bridges 106 may be included depending on the design of the microelectronic device 100. As can be seen in FIG. 1A, and provided that a length of the active bridges 106 is representative of respective distances (e.g., longer lines representing a longer distance and shorter lines representing a shorter distance), some of the active bridges (e.g., 106a, 106b, 106d, 106f, 106g, and 106h) are of a first size or length, while others of the active bridges (e.g., 106c and 106e) are of a second size or length. Thus, the active bridges 106 may comprise one or two (or more) standard designs/sizes, thereby allowing for repeatability with respect to structure within the microelectronic device 100. Other active bridges 106 (not shown) may be custom designed depending upon the design and/or requirements of a specific microelectronic device. Furthermore, the limited sizes of the active bridges 106 mean that needed redesigns for the microelectronic device 100 may be more cheaply and efficiently implemented by altering designs of the active bridges 106 as opposed to the need for redesigning the microchip 100.

The active bridges 106 may, as previously noted, provide the interface between the microchip 102 and the chiplets 104. Thus, critical area on the microchip 102 (and/or the chiplets 104) that in previous configurations or arrangements were utilized for an ASIC that would have been used for large interface IP may now be used for other circuitry and functions on the microchip 102, and even the chiplets 104.

As can be seen in FIG. 1A, the bridges 106 include circuitry 114a-114h, respectively. As previously noted, in configurations where one or more of the chiplets 104 are configured as HBM, the circuitry 114 of one or more corresponding active bridges 106 may include SRAM or similar memory that may be used for buffering of data prior to sending the data to the HBM for either scheduling or faster access to memory. For example, referring to FIG. 1B, chiplets 104a, 104b may be configured as memory chiplets 104a, 104b in the form of HBM that may provide level 4 (L4) memory and the circuitry 114a, 114b within the active bridges 106a, 106b may be in the form of SRAM 114a, 114b that may provide level 3 (L3) memory, e.g., cache. Placement of the L3 cache in the corresponding active bridge(s) 106a, 106b may allow for faster access because the corresponding active bridges 106a, 106b may be direct bonded to the microchip 102 directly over processing elements (not shown) of the microchip 102.

As can be seen in FIG. 1A, the active bridges 106 may allow for memory access to be placed where it is more ideal, e.g., memory access may not need to be along the periphery of the microchip 102 and/or the chiplets 104. The active bridges 106 may allow for memory access to be placed further away from the peripheral edges 116 of the microchip 102 and the peripheral edges 118 of the chiplets 104. Thus, the active circuitry 114 of the active bridges 106 may eliminate previous limits on the connection length of the HBM data lines (DQ) lines. This may lead to improved overall performance and functionality.

In configurations where the chiplets 104 are configured as memory, changes in the memory standard may be implemented by simply changing the design of the chiplets 104 and/or the design of the active bridges 106. Thus, it is possible to switch between HBM 2, HBM 3, HBM 4, DDR, LPDDR, etc.

Figure 1B:
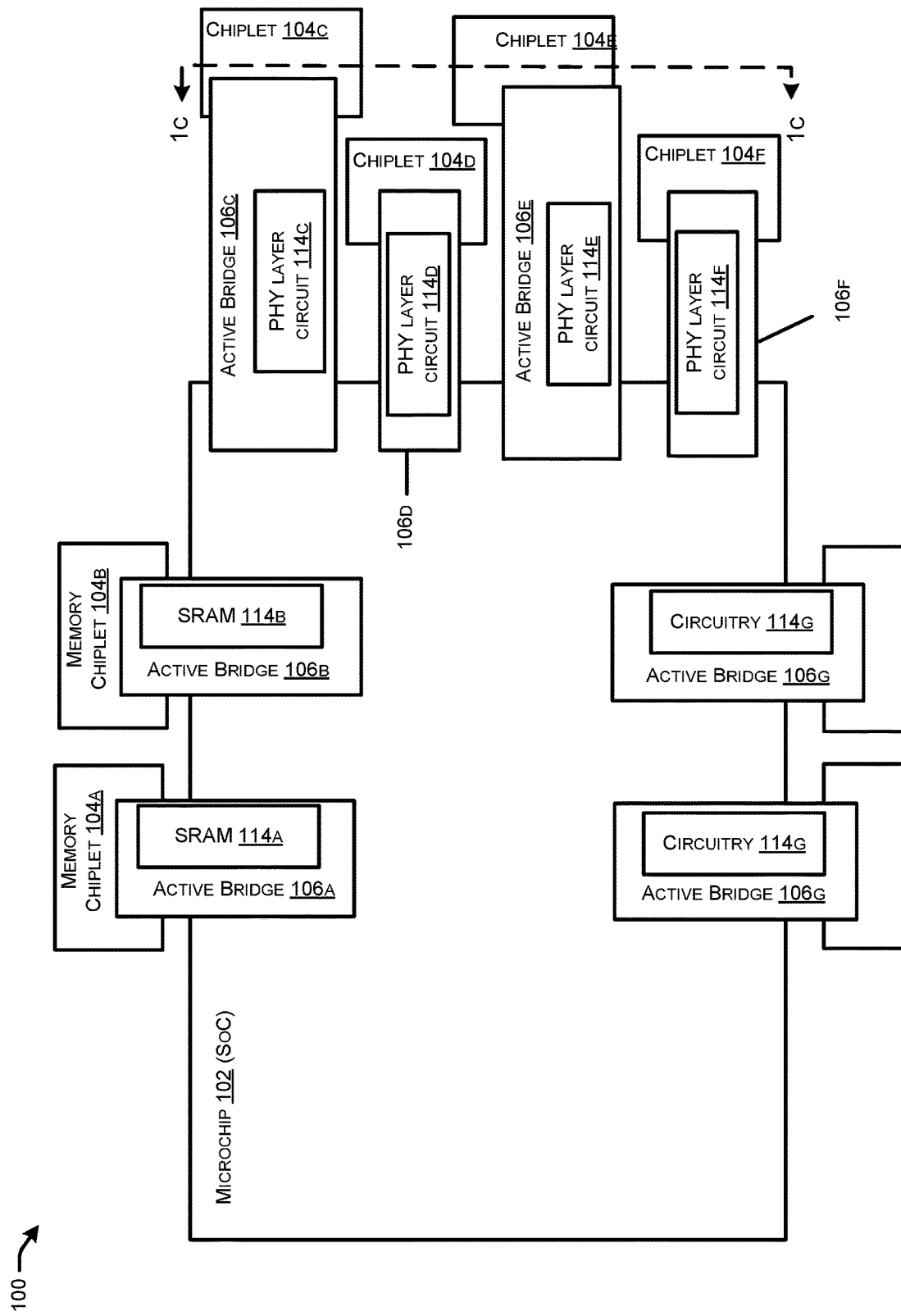

The circuitry 114 of the active bridges 106 may also be configured for controller/physical (PHY) layer circuits and functionality to allow for increased controller/physical (PHY) layer circuits and functionality. For example, referring to FIG. 1B, the circuitry 114c, 114d, 114e, 114f within the active bridges 106c, 106d, 106e, 106f may be in the form of PHY layer circuits 114c, 114d, 114e, 114f. This can lead to improved performance of the microelectronic device 100. Furthermore, the active bridges 106 may allow for the controller/PHY to be repeated utilizing multiple active bridges 106, as can be seen in FIG. 1B, in the microelectronic device 100. Previous configurations of microelectronic devices have required controller and PHY circuitry at both the microchip 102 and the chiplets 104. By placing the controller and PHY circuitry on the active bridges 106 using circuitry 114, the overall system of the microelectronic device 100 may be simplified by eliminating the cycles lost in the extra circuitry of having controllers and PHY circuitry on both the microchip 102 and the chiplets 104.

Thus, by utilizing active bridges 106 with some of their native interconnects connected directly to native interconnects of the microchip 102, e.g., by direct-bonding, and others of the active bridges' 106 native interconnects connected directly to native interconnects of the chiplets 104, e.g., by direct bonding, an example system, such as a microprocessor system, can be split among a plurality of configurable components. For example, certain functions, particularly more customized or confidential portions of the system, may be provided through circuitry and blocks on the microchip 102. Certain other functions, such as more routine or less customized portions of the system, can be provided through circuitry and blocks on the active bridges 106 and/or the chiplets 104, particularly when the active bridges 106 and/or the chiplets 104 are significantly smaller than the active base die 108. The active bridges 106 may pass signals between the microchip 102 and connected chiplets 104 during operation of the example system.

As an example configuration, certain memory IP cores, e.g., L3 cache, of the active bridges 106 may be aligned generally with processor cores or with execution engines of the microchip 102 to allow minimal trace lengths and maximum speed. More mundane and standardized cores, such as phase-locked loops (PLLs), memories, and so forth may be moved off of the microchip 102 to the active bridges 106 and/or chiplets 104, thereby freeing up space on the microchip 102. This partitioning can also allow the microchip 102 and various IP core dies to be produced at different semiconductor manufacturing facilities, and to be run at different voltages, all within the same example microelectronic device 100.

Thus, the active bridges 106 communicatively connect the microchip 102 and chiplets 104 together, instead of relying on a monolithic integrated circuit design. Moreover, the length of the data path formed by the interconnection between the active bridge 106 and the native conductors of the microchip 102, as well as the length of the data path formed by the interconnection between the active bridge 106 and a given chiplet 104, may be short, for example as short as 1 um, or less. Other connection methods may be used to connect the active bridges 106 to the microchip 102 and the chiplets 104, as long as the other connection methods provide a pitch of 10 um, or less.

Examples of microchip 102 and chiplet 104 designs that may be connected using active bridges 106 include, for example, microchip 102 configured as a system on chip (SoC) or network on chip (NoC) and chiplets 104 configured as memory.

In configurations, the active bridge 106 may include circuitry 114 that provides an interconnect that provides level shifting between the microchip 102 and a coupled chiplet 104. Thus, the circuitry 114 may be used to translate signals from one logic level or voltage domain to another between the microchip 102 and a chiplet 104, thereby allowing compatibility between integrated circuits (ICs) of the microchip 102 and a chiplet 104 with different voltage requirements, such as, for example, transistor-transistor logic (TTL) and complementary metal-oxide semiconductor (CMOS). Thus, the level shifting circuitry may bridge domains between processors, logic, sensors, and other circuits of the microchip 102 and a chiplet 104.

The active bridge 106 may also include circuitry 114 that provides re-clocking between two interconnected dies, e.g., the microchip 102 and a chiplet 104. This may be done, for example, to reduce or eliminate the jitter that may accumulate on sampled data received from a noisy core. This may be accomplished, for example, by re-clocking or "re-timing" the data with an edge triggered D-type output register that is driven (clocked) by a low jitter clock, before transmitting the data to successive stages, e.g., to the microchip 102 or the chiplet 104. The edge triggered D-type output register may thus be included as part of the circuitry 114 of an active bridge 106.

Furthermore, the active bridges 106 may include circuitry 114 that allows for clock gating and voltage gating between interconnected dies, e.g., between the microchip 102 and chiplets 104, connected by the active bridges 106. Also, the clock distribution between two interconnected dies may be handled by circuitry of the active bridges 106 connecting the two dies, e.g., the circuitry 114 may provide the master clock for the microchip 102 and a chiplet 104 connected to the microchip 102 by the active bridge 106.

In configurations, a microelectronic device, e.g., microelectronic device 100, may include multiple microchips 102 that may be connected using active bridges 106. The active bridge 106 may thus include circuitry 114 that provides a buffered interconnect between two microchips. Additionally, the microelectronic device, e.g., microelectronic device 100, may include multiple chiplets 104 that may be configured the same, e.g., all are configured as memory, or at least some of the chiplets 104 may be configured differently from other chiplets 104.

Figure 1C:
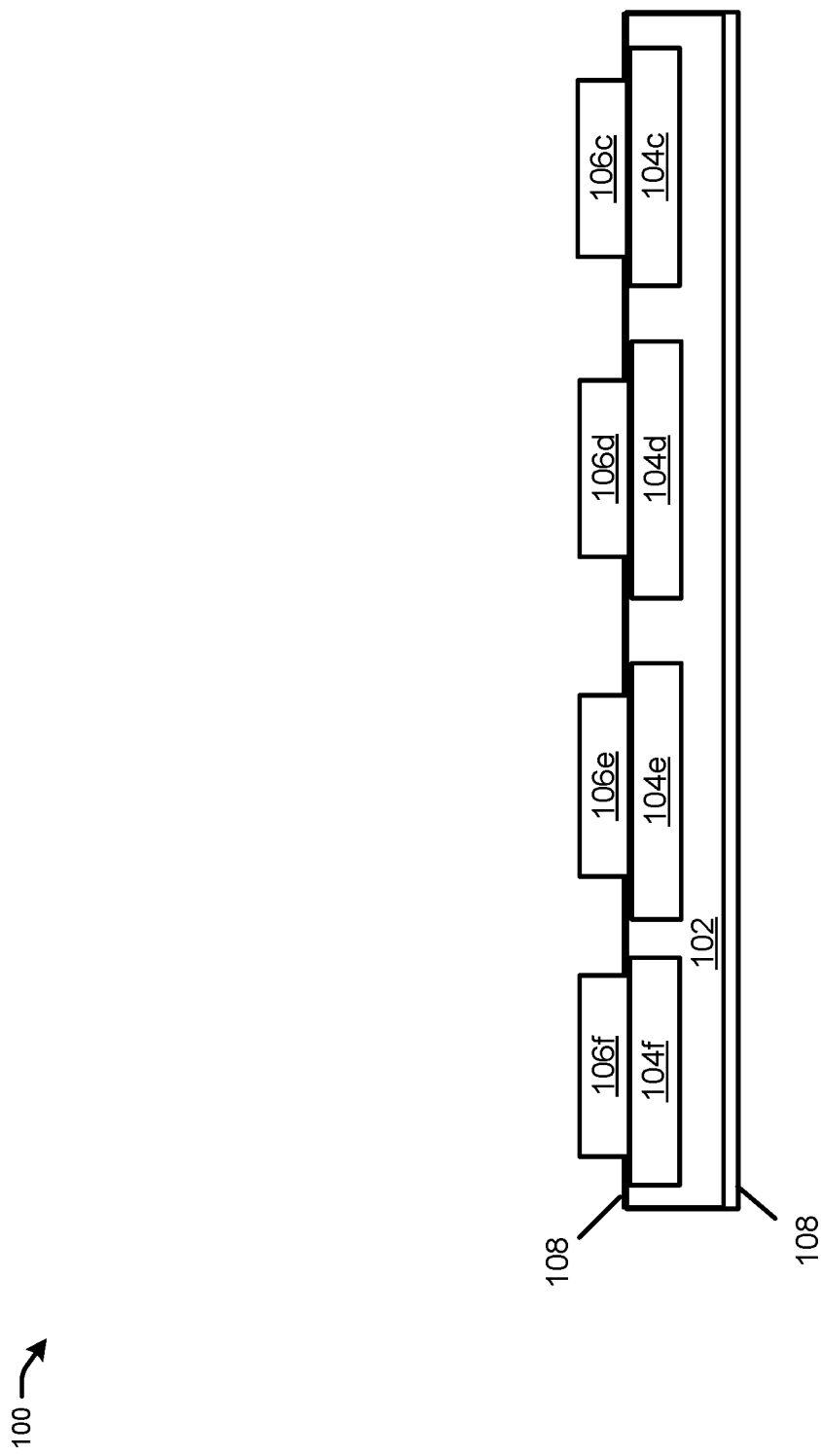
Figure 1D:
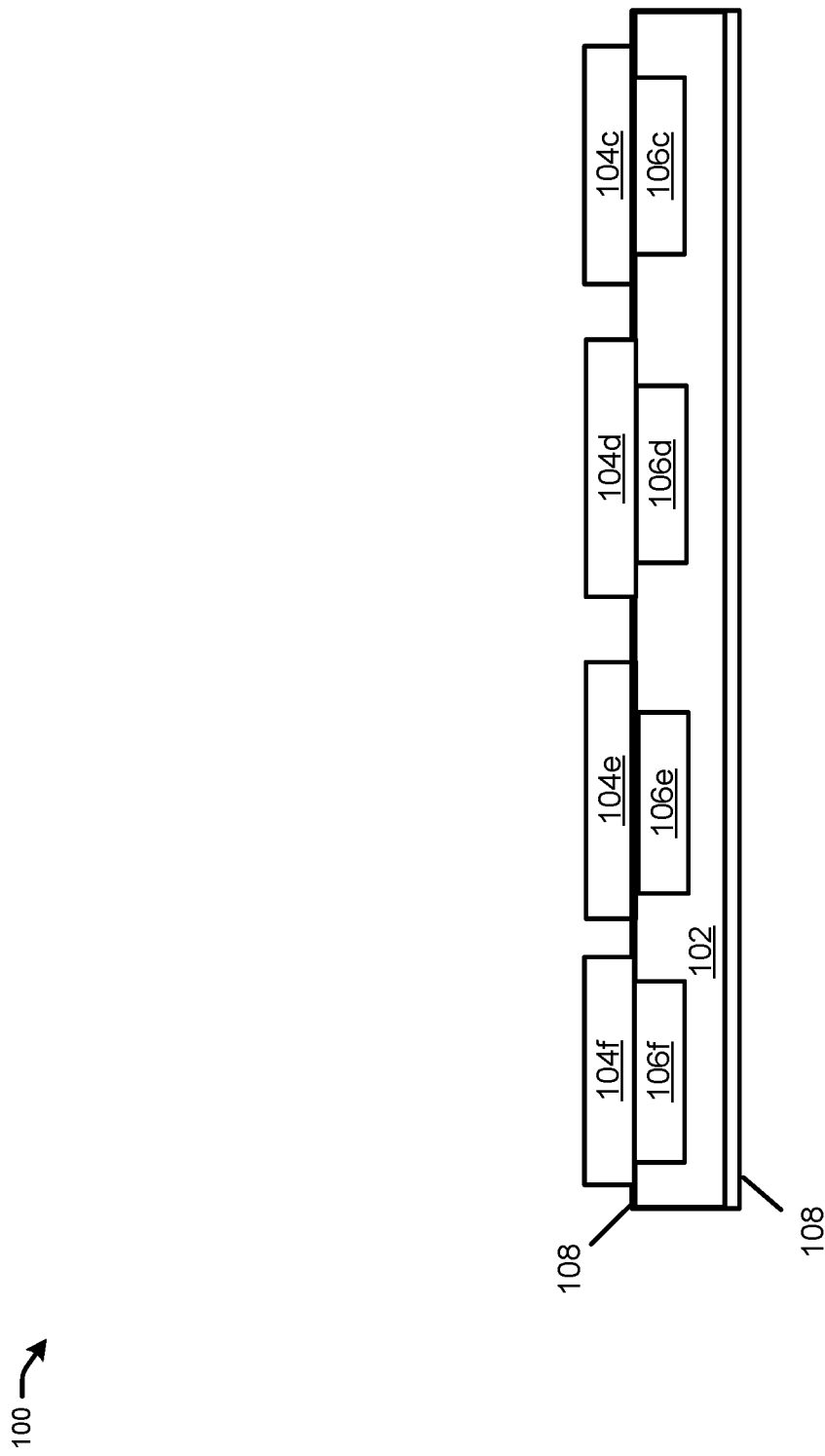
Figure 1E:
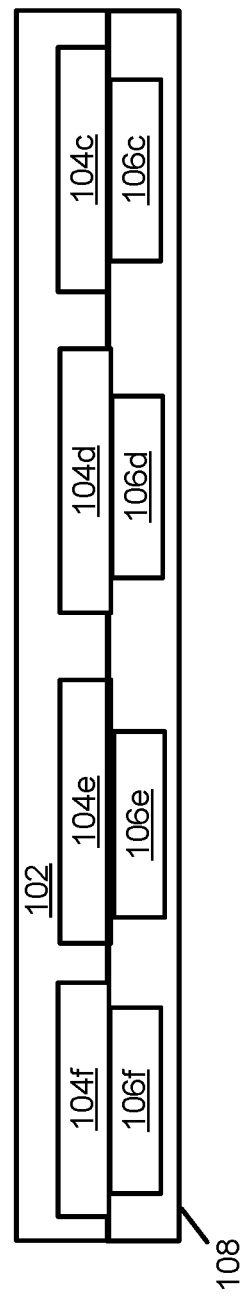

FIGS. 1C-1E illustrate a cross-sectional view of the microelectronic device 100 of FIGS. 1A and 1B as seen along the line 1C-1C. Thus, FIG. 1C provides a vertical view of some of the chiplets 104c, 104d, 104e, and 104f coupled to the microchip 102 via the active bridges 106c, 106d, 106e, and 106f. As can be seen in FIG. 1C, the microchip 102 and chiplets 106c, 106d, 106e, and 106f may be embedded in a wafer 108 and the active bridges 106c, 106d, 106e, and 106f may then be added to couple the chiplets 104c, 104d, 104e, and 104f to the microchip 102 using, for example, DBI. Referring to FIG. 1D, in configurations, the active bridges 106c, 106d, 106e, and 106f may be embedded in the wafer 108 with the microchip 102. Referring to FIG. 1E, in configurations, the active bridges 106c, 106d, 106e, and 106f may be embedded in the wafer 108, along with the other active bridges 106a, 106b, 106g, and 106h, by themselves and the microchip 102 and chiplets 104 may be coupled to the active bridges 106.

Referring to FIG. 1C-1E, an example method of manufacturing the microelectronic device 100 may include building the microchip 102 and chiplets 104 and embedding the microchip 102 and chiplets 104a-104h (not all visible in FIG. 1C) in the wafer 108 (not shown in FIGS. 1A and 1B). The wafer 108 may be singulated and the bottom of the wafer 108 may be ground or filed down to nothing or nearly nothing. The active bridges 106a-106h (not all visible in FIG. 1C) may then be added to couple the chiplets 104a-104h (not all visible in FIG. 1C) to the microchip 102 using, for example, DBI. A mold/encapsulation step may be performed to provide a molding (not illustrated) to protect the overall microelectronic device 100. Referring to FIG. 1E, in configurations, the active bridges 106 may be embedded in the wafer 108, e.g., a reconstituted wafer, which may then be singulated and the microchip(s) 102 and chiplets 104 may be added or coupled to the active bridges 106, e.g., the process may be performed in a reverse order. As noted with respect to FIG. 1D, the microchip 102 and the active bridges 106 may be embedded within the wafer 108. As is known, during the molding and encapsulation steps, vias (not shown) may be cut out to allow for signal transmission.

In a configuration, the microchip 102 is a silicon or other semiconductor die. In some configurations, the microchip 102 may be smaller than a chiplet 104. In some cases, the microchip 102 may be made of a substrate material such as a polymer, with embedded semi-conductor dies, or the microchip 102 may be mainly silicon or semiconductor, with other materials present for various reasons. The microchip 102 contains active circuitry and functional blocks that give a particular integrated circuit its functional identity. The customization of the particular microelectronic device 100 is in or on the microchip 102, while the chiplets 104 are generally standard, well-established, or ubiquitous units, usually containing a proprietary IP block.

In general, chiplets 104 are dies that may be made in various silicon foundry processing facilities. The chiplets 104 may have various configurations (HPP, HPC, HPC+, etc.), which may exhibit different voltages of operation. The voltage differences may mismatch the chiplets 104 with the microchip 102 and thus, the circuitry 114 of an active bridge 106 coupling a chiplet 104 to the microchip 102 may remedy these variances in operating voltages.

In a configuration, an example chiplet 104 has multiple independent functions and multiple ports that may communicate with a plurality of functional elements. The example chiplet 104 may have communication paths between its independent onboard functions. As previously noted, in a configuration, the chiplet 104 may be a memory device with two or more independently addressable memory blocks. The microchip 102 can interface with the native signals of such an example chiplet 104 via an active bridge 106 and take advantage of the functional elements of the chiplet 104.

In general, the active bridges 106 are dies that may be made in various silicon foundry processing facilities. The active bridges 106 include active circuitry and functional blocks, e.g., circuitry 114, that provide one or more of the various functions as described herein when connecting two dies, e.g., a microchip 102 and a chiplet 104. Thus, the active bridges 106 may provide multiple functions as described herein when connecting two dies, e.g., a microchip 102 and a chiplet 104.

Figure 2:
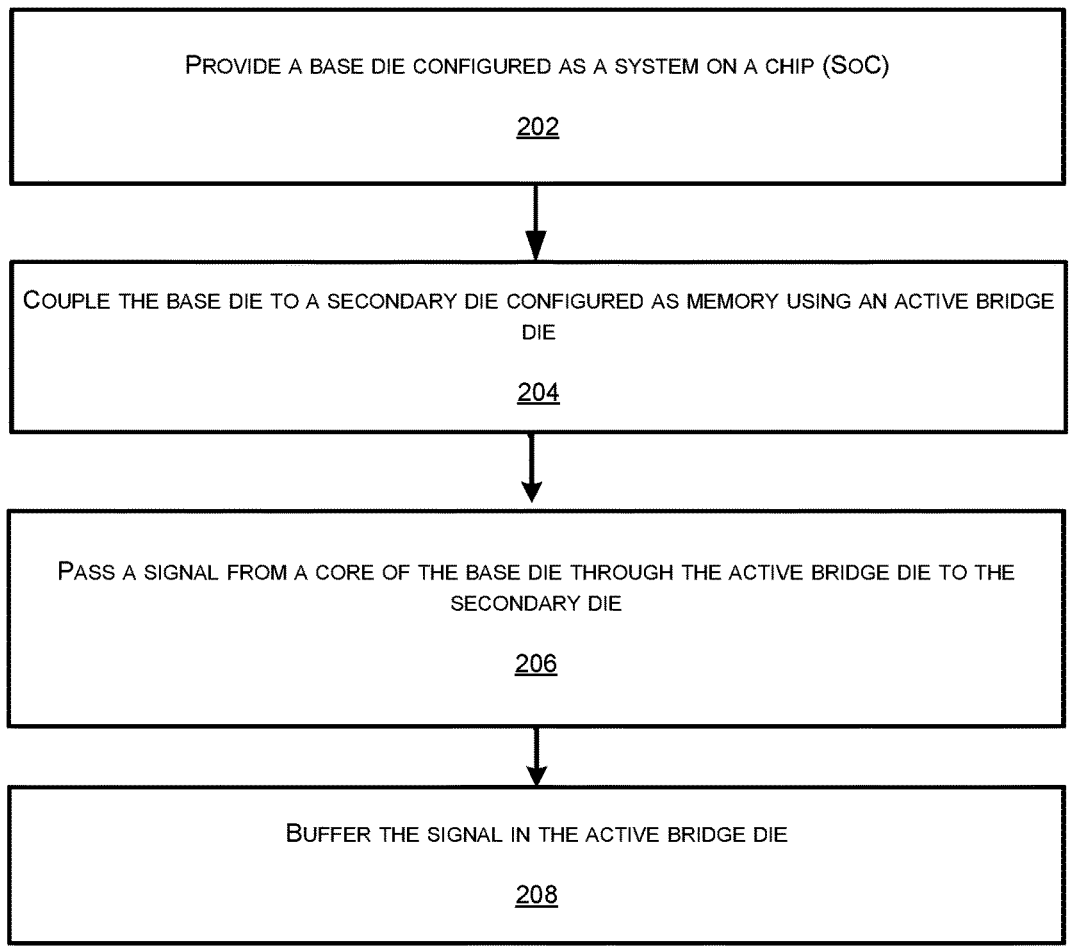
FIG. 2 illustrates a flow diagram for signal drive using an active bridge die between a base die, e.g., the microchip, and a secondary die, e.g., a chiplet, of the microelectronic device of FIGS. 1A-1E.

FIG. 2 illustrates a flow diagram of an example method 200 for signal drive using an active bridge die between a base die and a secondary die of a microelectronic device, e.g., electronic device 100. In the flow diagram, the operations of method 200 are shown as individual blocks.

At block 202, a base die configured as a system on a chip (SoC) is provided. For example, the base die may be at least similar to microchip 102

At block 204, the base die is coupled to a secondary die configured as memory using an active bridge die. The base die may be coupled to the active bridge die via direct bond interconnect (DBI) and the active bridge die may be coupled to the secondary die with the base die via DBI. The active bridge die may comprise active circuitry configured to actively perform at least one function. For example, an active bridge 106 may be used to connect the base die and the secondary die, e.g., a chiplet 104, using DBI.

At block 206, a signal is passed from a core of the base die through the active bridge die to the secondary die.

At block 208, the signal is buffered in the active bridge die. For example, active circuitry of the active bridge die, e.g., circuitry 114, may be used to buffer the signal during passage of the signal through the active bridge die.

While the invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A microelectronic device comprising:
   a base die configured as a system on chip (SoC);
   a plurality of secondary dies positioned outside one or more peripheral edges of the base die, wherein the plurality of secondary dies comprises at least a first device and a second device positioned outside of a same peripheral edge of the base die, the first device positioned further from the same peripheral edge of the base die than the second device; and
   a plurality of active bridge dies communicatively coupling the plurality of secondary dies to the base die, wherein the plurality of active bridge dies comprises at least (i) a first active bridge die communicatively coupling the first device to the base die and (ii) a second active bridge die communicatively coupling the second device to the base die, and wherein the one or both of the first and second active bridge dies are configured to re-clock a signal received at the base die from a respective one of the first or second device relative to a signal received at the base die from the other one of the first or second device.

2. The microelectronic device of claim 1, wherein a secondary die of the plurality of secondary dies is configured as high bandwidth memory (HBM).

3. The microelectronic device of claim 2, wherein an active bridge die of the plurality of active bridge dies corresponding to the secondary die is configured to provide buffering between the base die and the secondary die.

4. The microelectronic device of claim 1, wherein an active bridge die of the plurality of active bridge dies is coupled to the base die via direct bond interconnect (DBI) and the active bridge die is coupled to a corresponding secondary die of the plurality of secondary dies via DBI.

5. The microelectronic device of claim 1, wherein an active bridge die of the plurality of active bridge dies is configured to provide an interface between the base die and a corresponding secondary die of the plurality of secondary dies.

6. The microelectronic device of claim 1, wherein an active bridge die of the plurality of active bridge dies is configured to provide physical (PHY) layer and controller functions for the base die and a corresponding secondary die of the plurality of secondary dies.

7. The microelectronic device of claim 1, wherein an active bridge die of the plurality of active bridge dies is configured to provide a cache.

8. The microelectronic device of claim 7, wherein a secondary die corresponding to the active bridge die is configured as a SoC.

9. The microelectronic device of claim 8, wherein the active bridge die is configured to provide buffering between the base die and the secondary die.

10. The microelectronic device of claim 1, wherein an active bridge die of the plurality of active bridge dies is configured to provide at least one of (i) an interconnect with level shift between the base die and a corresponding secondary die of the plurality of secondary dies, (ii) clock gating between the base die and the corresponding secondary die, (iii) voltage gating between the base die and the corresponding secondary die, and (iv) clock distribution between the base die and the corresponding secondary die.

11. A microelectronic device comprising:
    a base die configured as a system on chip (SoC);
    a plurality of secondary dies positioned outside one or more peripheral edges of the base die, wherein at least one secondary die of the plurality of secondary dies is configured as memory, wherein the plurality of secondary dies comprises at least a first device and a second device positioned outside of a same peripheral edge of the base die, the first device positioned further from the same peripheral edge of the base die than the second device; and
    a plurality of active bridge dies coupled to the base die via direct bond interconnect (DBI) and coupled to the plurality of secondary dies via DBI, wherein the plurality of active bridge dies comprises at least (i) a first active bridge die communicatively coupling the first device to the base die and (ii) a second active bridge die communicatively coupling the second device to the base die, and wherein one or both of the first or second active bridge dies are configured to re-clock a signal received at the base die from a respective one the first device or second device relative to a signal received at the base die from the other one of the first or second device.

12. The microelectronic device of claim 11, wherein an active bridge die of the plurality of active bridge dies is configured to provide buffering between the base die and a corresponding secondary die of the plurality of secondary dies.

13. The microelectronic device of claim 12, wherein an active bridge die of the plurality of active bridge dies is configured to provide an interface between the base die and a corresponding secondary die of the plurality of secondary dies.

14. The microelectronic device of claim 11, wherein an active bridge die of the plurality of active bridge dies is configured to provide physical (PHY) layer and controller functions for the base die and a corresponding secondary die of the plurality of secondary dies.

15. The microelectronic device of claim 11, wherein an active bridge die of the plurality of active bridge dies is configured to provide a cache.

16. The microelectronic device of claim 11, wherein an active bridge die of the plurality of active bridge dies is configured to provide at least one of (i) an interconnect with level shift between the base die and a corresponding secondary die of the plurality of secondary dies, (ii) clock gating between the base die and the corresponding secondary die, (iii) voltage gating between the base die and the corresponding secondary die, and (iv) clock distribution between the base die and the corresponding secondary die.

17. A method for forming a microelectronic device comprising a base die configured as a system on a chip (SoC), a plurality of secondary dies positioned outside one or more peripheral edges of the base die, and a plurality of active bridge dies, the method comprising:

communicatively coupling the base die to the plurality of secondary dies using the plurality of active bridge dies, the base die coupled to the plurality of active bridge dies via direct bond interconnect (DBI) and the plurality of active bridge dies coupled to the plurality of secondary dies via DBI, wherein the plurality of secondary dies comprises at least a first device and a second device positioned outside of a same peripheral edge of the base die, the first device positioned further from the same peripheral edge of the base die than the second device, wherein the plurality of active bridge dies comprises at least (i) a first active bridge die communicatively coupling the first device to the base die and (ii) a second active bridge die communicatively coupling the second device to the base die, and wherein one or both of the first or second active bridge dies are configured to re-clock a signal received at the base die from a respective one of the first or second device relative to a signal received at the base die from the other one of the first or second device;

passing a signal from one of the first or second device to a core of the base die through a respective active bridge die; and re-clocking the signal in the respective active bridge die relative to a signal received at the core of the base die from the other one of the first or second device.

18. The method of claim 17, wherein an active bridge die of the plurality of active bridge dies provides an interface between the base die and a corresponding secondary die of the plurality of secondary dies.

19. The method of claim 17, wherein an active bridge die of the plurality of active bridge dies provides physical (PHY) layer and controller functions for the base die and a corresponding secondary die of the plurality of secondary dies.

20. The method of claim 17, wherein an active bridge die of the plurality of active bridge dies provides a cache.

\* \* \* \* \*